(12) United States Patent
Chung et al.

(10) Patent No.: US 6,218,691 B1
(45) Date of Patent: Apr. 17, 2001

(54) IMAGE SENSOR WITH IMPROVED DYNAMIC RANGE BY APPLYING NEGATIVE VOLTAGE TO UNIT PIXEL

(75) Inventors: In Sool Chung; Seong Dong Kim, both of Ichon (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/343,096

(22) Filed: Jun. 29, 1999

(30) Foreign Application Priority Data

| Jun. 30, 1998 | (KR) | 98-25231 |
| Dec. 24, 1998 | (KR) | 98-58623 |
| Dec. 24, 1998 | (KR) | 98-58624 |

(51) Int. Cl.[7] .................. H01L 31/062; H01L 31/113
(52) U.S. Cl. .................. 257/290; 257/291; 257/292; 257/443; 257/446; 438/66
(58) Field of Search .................. 257/291, 292, 257/290, 443, 446; 438/66

(56) References Cited

U.S. PATENT DOCUMENTS

| 4,877,951 | * | 10/1989 | Muro | 250/211 J |
| 5,360,987 | * | 11/1994 | Shibib | 257/446 |
| 5,466,962 | * | 11/1995 | Yamamoto et al. | 257/437 |
| 5,587,596 | | 12/1996 | Chi et al. | 257/223 |
| 5,608,243 | | 3/1997 | Chi et al. | 257/249 |
| 5,920,092 | * | 7/1999 | Watanabe | 257/292 |

FOREIGN PATENT DOCUMENTS

| 401135184 | * | 5/1989 | (JP) . |
| 410209422 | * | 8/1998 | (JP) . |

* cited by examiner

Primary Examiner—William Mintel
(74) Attorney, Agent, or Firm—Townsend and Townsend and Crew LLP (57) ABSTRACT

The present invention is to provide an image sensor, including: a semiconductor substrate of a first conductive type: a peripheral circuit formed on a first region of the semiconductor substrate, wherein a ground voltage level is applied to the first region; a unit pixel array having a plurality of unit pixels formed on a second region of the semiconductor substrate, wherein the first region is isolated from the second region and wherein a negative voltage level is applied to the second region; and a negative voltage generator for providing the negative voltage for the second region.

8 Claims, 8 Drawing Sheets

IMAGE SENSOR WITH IMPROVED DYNAMIC RANGE BY APPLYING NEGATIVE VOLTAGE TO UNIT PIXEL

FIELD OF THE INVENTION

The present invention relates to an image sensor; and, more particularly, to a CMOS (Complementary Metal Oxide Semiconductor) image sensor with improved dynamic range by applying a negative voltage to a unit pixel.

DESCRIPTION OF THE PRIOR ART

Generally, a CMOS image sensor is an apparatus that converts an optical image into electrical signals using MOS (Metal Oxide Semiconductor) transistors. A CCD (Charge Coupled Device) image sensor, as a king of image sensor, is widely known. As compared with the CCD image sensor, the CMOS image sensor may be easily driven with various scanning schemes and integrated with a signal processing circuit on one-chip. Therefore, the CMOS image sensor may be miniaturize in size and, consequently, a reduction in the fabricating cost and the power consumption may be realized using a compatible CMOS technology.

Figure 1:
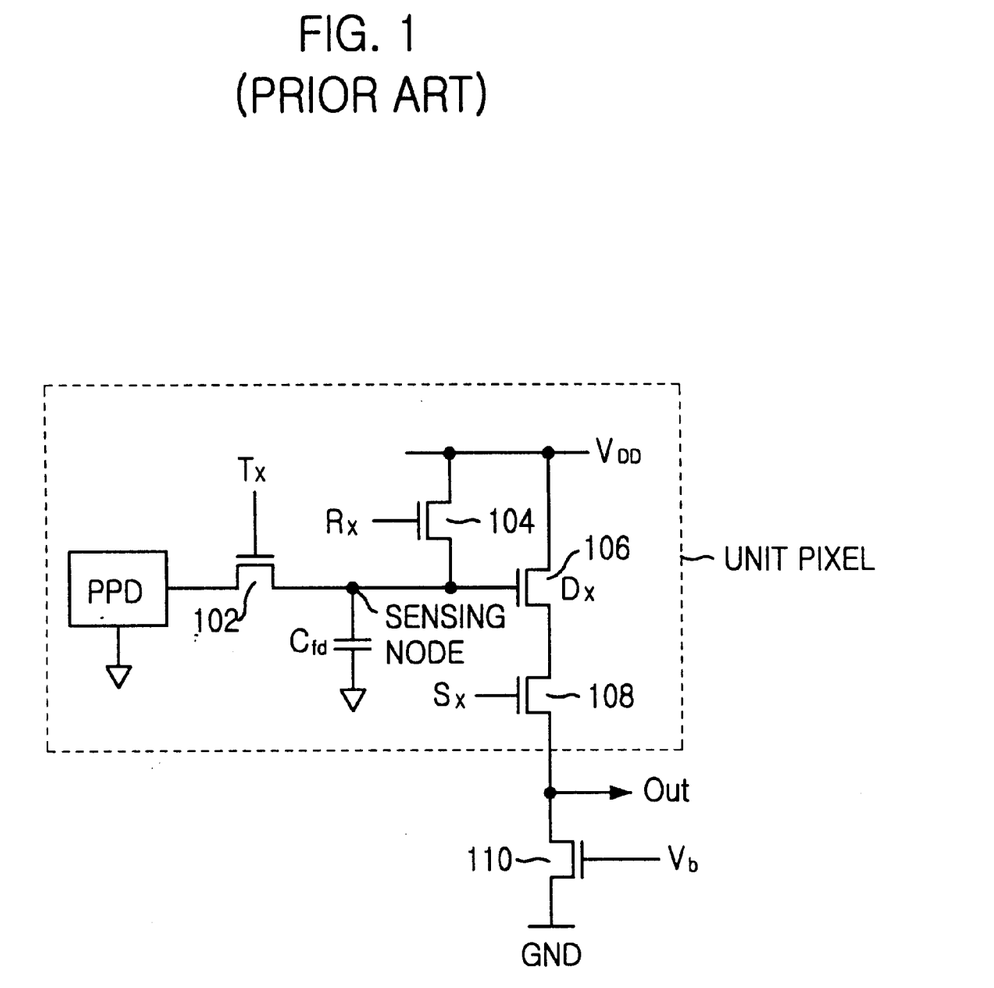
FIG. 1 is a circuit diagram illustrating a unit pixel of a conventional CMOS image sensor.

Referring to FIG. 1, a conventional unit pixel of a CMOS image sensor is composed of a pinned photodiode (PPD) and four NMOS transistors. The four NMOS transistors include a transfer transistor 102 for transferring photoelectric charges generated in a pinned photodiode to a sensing node, a reset transistor 104 for resetting the sensing node in order to sense a next signal, a drive transistor 106 that functions as a source follower and a select transistor 108 outputting data to an output terminal in response to an address signal.

The reset transistor 104 and the transfer transistor 102 are made up of a native NMOS transistor so that charge transfer efficiency is improved. The native NMOS transistor has about a zero threshold voltage, which helps prevent electron losses from being generated that would otherwise occur for transistors having a positive threshold voltage. A load transistor 110 which is positioned between an output terminal (OUT) of the unit pixel and the group voltage level, receives a biasing signal from an external device and is used to bias the unit pixel. A capacitance of a floating diffusion is referred to as "$C_{fd}$".

Figure 2:
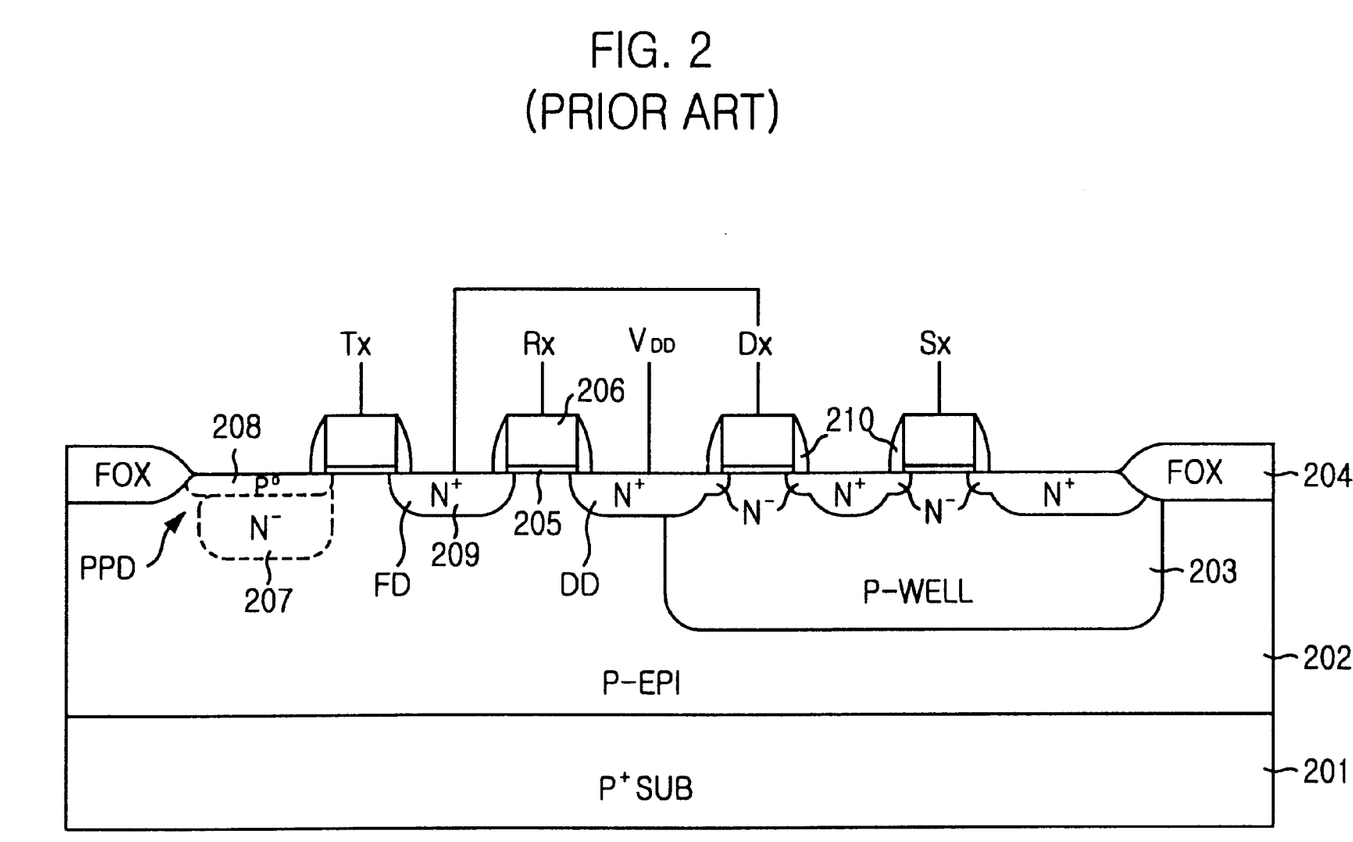
FIG. 2 is a cross-sectional view illustrating a structure of the unit pixel in FIG. 1.

Referring to FIG. 2, the conventional unit pixel of the CMOS image sensor includes a P$^+$ silicon substrate 201, a P-epi (epitaxial) layer 202, a P-well region 203, field oxide layers 204, a gate oxide layer 205, gate electrodes 206, an N$^-$ diffusion region 207, a P$^0$ diffusion region 208, an N$^+$ diffusion region 209 and oxide layer spacers 210. A pinned photodiode (PPD) has a PNP junction structure in which the P-epi 202, the N$^-$ diffusion region 207 and the P$^0$ diffusion region 208 are stacked. The P-epi layer 202, to which the ground voltage level is applied, is formed on the P$^+$ silicon substrate 201. Since a voltage of the P$^+$ silicon substrate 201 is fixed to the ground voltage level and a voltage variation range of the floating diffusion is limited, a voltage variation range of the output terminal of the unit pixel is very small. So, there is a problem that dynamic range of the unit pixel is also limited.

Since a power supply $V_{DD}$ of the unit pixel is 2.5V, 3V or 5V in a sub-micron CMOS technology and a voltage of the pinned photodiode is fixed to the ground voltage level, a pinning voltage, which fully depletes the N$^-$ diffusion region 207 of the pinned photodiode, should be at 0V or between a punch-through voltage of the transfer transistor 102 and the power supply $V_{DD}$. When the pinning voltage is very high, it is difficult for the photoelectric charges to be fully transferred to the floating sensing node in the power supply of 3.3V. That is, when the charge transfer efficiency becomes very low, a charge capacity becomes very small and the quantum efficiency is depreciated.

As a result, since the charge transfer efficiency and the quantum efficiency have a trade-off relation to each other, it is difficult for both of them to be individually and independently optimized.

On the other hand, a voltage variation range represents a voltage sensitivity and decides the dynamic range of the output terminal of the unit pixel. However, since the conventional unit pixel may not increase the voltage variation range, the dynamic range of the output terminal of the unit pixel is substantially limited.

SUMMARY OF THE INVENTION

It is, therefore, an object of the present invention to provide an image sensor that is characterized by an improved output dynamic range and respectable charge transfer and quantum efficiencies the quantum efficiency on a best condition.

In accordance with an aspect of the present invention, there is provided an image sensor, comprising: a semiconductor substrate of a first conductivity type: a peripheral circuit formed on a first region of the semiconductor substrate, wherein a ground voltage level is applied to the first region; a unit pixel array having a plurality of unit pixels formed on a second region of the semiconductor substrate, wherein the first region is isolated from the second region and wherein a negative voltage level is applied to the second region; and a negative voltage circuit configured to provide the negative voltage for the second region.

BRIEF DESCRIPTION OF THE DRAWINGS

Other objects and aspects of the invention will become apparent from the following description of the embodiments with reference to the accompanying drawings, in which.

DETAILED DESCRIPTION OF THE INVENTION

Hereafter, the present invention will be described in detail with reference to the accompanying drawings.

Figure 3:
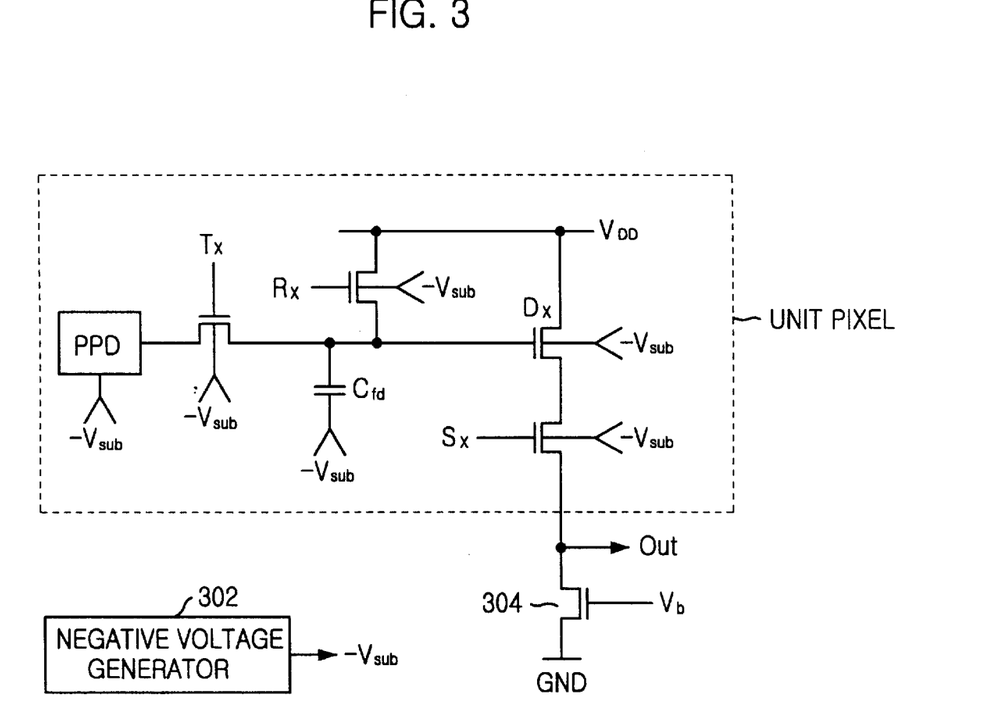
FIG. 3 is a circuit diagram illustrating a unit pixel of a CMOS image sensor according to the present invention.

As shown in FIG. 3, an image sensor of the present invention includes a peripheral circuit and a unit pixel. The peripheral circuit includes a negative voltage generator 302 and a load transistor 304. The peripheral circuit and the unit pixel are electrically isolated from each other. The semiconductor substrate of the peripheral circuit is set to a voltage level of ground and that of the unit pixel is configured to receive a negative voltage generated from the negative voltage generated 302 or via a negative voltage supplied from an external circuit through a pin of a chip.

It should be noted that the unit pixel of the present invention receives a negative voltage ($-V_{sub}$) from the negative voltage generator 302. A pinned photodiode (PDD) and a floating sensing node also receive the negative voltage, for example approximately −2V, from the negative voltage generator 302. Similarly, transfer, reset, drive and select transistors Tx, Rx, Dx and Sx receive the negative voltage. That is, the four transistors receive a reverse bias voltage.

The pinning voltage of the pinned photodiode may be set at a low level so that the charge transfer efficiency is increased. Also, although the pinning voltage of the pinned photodiode may be set at a low level, the semiconductor substrate has a negative voltage of −2V. Accordingly, if the pinning voltage of the pinned photodiode is set at a low level, the reverse bias voltage applied to the pinned photodiode is able to form a deep depletion layer.

The reset and transfer transistors Rx and Tx are made up of a native NMOS transistor so that the charge transfer efficiency is improved. A native NMOS transistor, which has about a zero threshold voltage, can prevent electron losses from being generated, compared to an NMOS transistor having a positive threshold voltage. Hence, use of native NMOS transistors helps to improve the charge transfer efficiency of the sensor. Since the reverse bias voltage is used in the unit pixel of the present invention, a threshold voltage of each transistor may be increased. Accordingly, when the transistors are designed, the threshold voltage should be considered. The threshold voltage of the transfer and reset transistors Tx and Rx should be decreased such that the photoelectric charges are efficiently transferred. $N^+/P$ junction and MOS capacitor photodiodes, as an alternative to the pinned photodiode may be applied to the unit pixel of the present invention.

Figure 4:
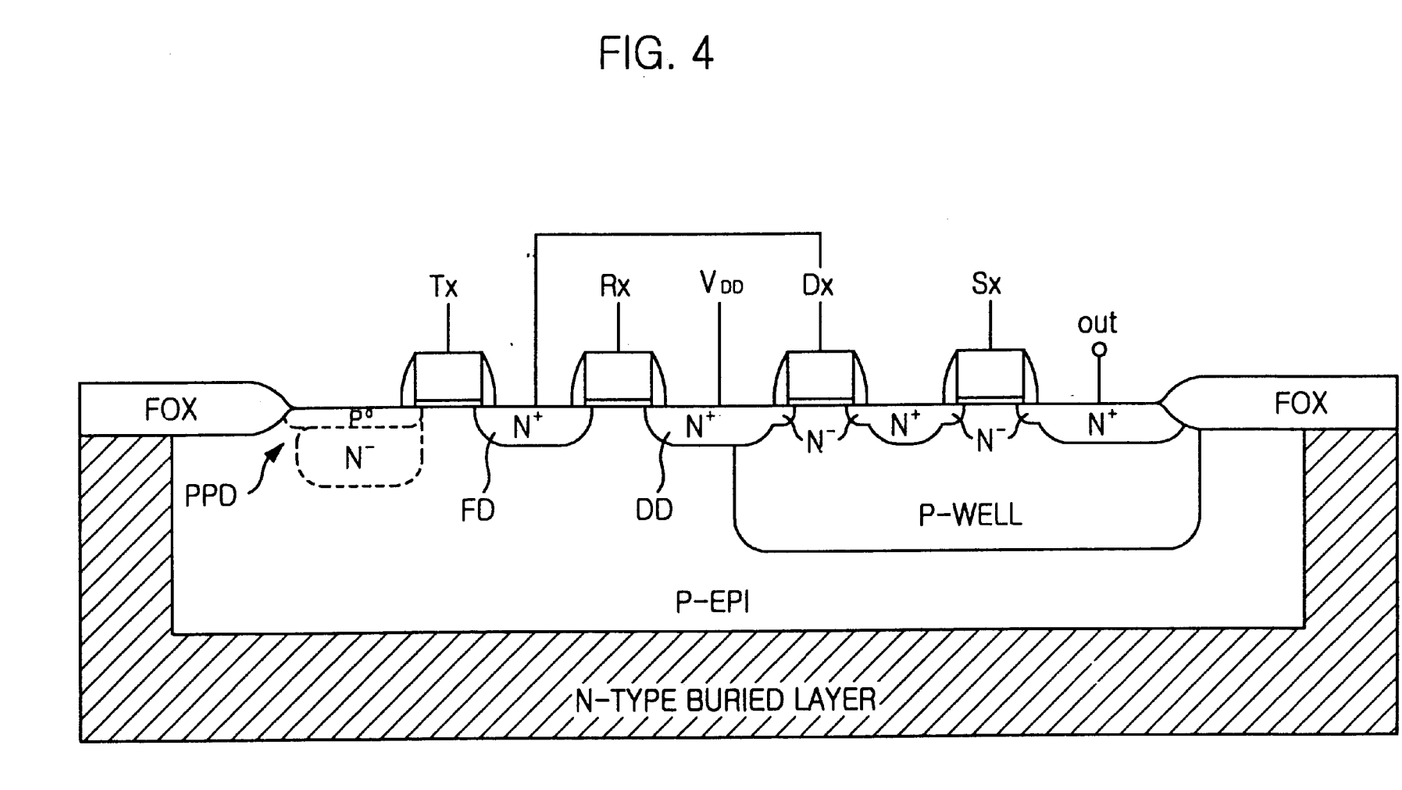
FIG. 4 is a cross-sectional view illustrating a structure of the unit pixel in FIG. 3.

As shown in FIG. 4, it should be noted that an N-type buried layer is provided in a P-epi layer of the unit pixel, which is formed on a $P^+$ substrate (not shown), and the unit pixel is isolated from the P-epi layer of a peripheral circuit by the N-type buried layer. Also, it should be noted that a negative voltage is applied to the P-epi layer in which elements of the unit pixel are formed.

Various methods for applying a negative voltage to the P-epi layer may be used. For example, a $P^+$ diffusion region (not shown) made in a portion of the P-epi layer of the unit pixel, which is isolated from the P-epi layer of a peripheral circuit by the N-type buried layer, and a wire for applying a negative voltage to the P-epi layer is in contact with the $P^+$ diffusion region, so that a negative voltage may be applied to the P-epi layer of the unit pixel.

On the other hand, when unit pixels are isolated from each other by the N-type buried layer, each of the unit pixels needs the $P^+$ diffusion and wiring processes. The unit pixel array is divided by the N-type buried layer and a negative voltage is applied to the divided unit pixel array. At this time, field oxide layers are formed between the unit pixels and the unit pixels should be isolated from the peripheral circuit by the N-type buried layer. The P-epi layer of the unit pixel is surrounded by the N-type buried layer so that the P-epi layer of the unit pixel is isolated from the P-epi layer of the peripheral circuit, and independently receives a negative voltage.

A pinned photodiode (PPD) and an $N^+$ floating junction FD are formed in the P-epi layer. The pinned photodiode senses light from an object and generates photoelectric charges. The $N^{+0}$ floating junction receives the photoelectric charges from the pinned photodiode. To detect electrical signals from the $N^+$ floating junction FD, an output transistor having a positive threshold voltage is formed in a P-well of the P-epi layer. The output transistor is composed of drive and select transistors Dx and Sx. Also, in order to transfer the photoelectric charges from the pinned photodiode to the $N^+$ floating junction FD, the transfer transistor Tx having a negative threshold voltage is formed in the P-epi layer. The reset transistor Rx and a $N^+$ drain diffusion region DD, to which a power supply $V_{DD}$ is applied, are formed in the P-epi layer. The $N^+$ floating junction FD and the $N^+$ drain diffusion region DD are composed of a heavily doped region in order to reduce an overlap capacitance with a gate electrode.

As shown in FIGS. 5A to 5D, a method for fabricating a CMOS image sensor with the N-type buried layer is provided.

Figure 5A:
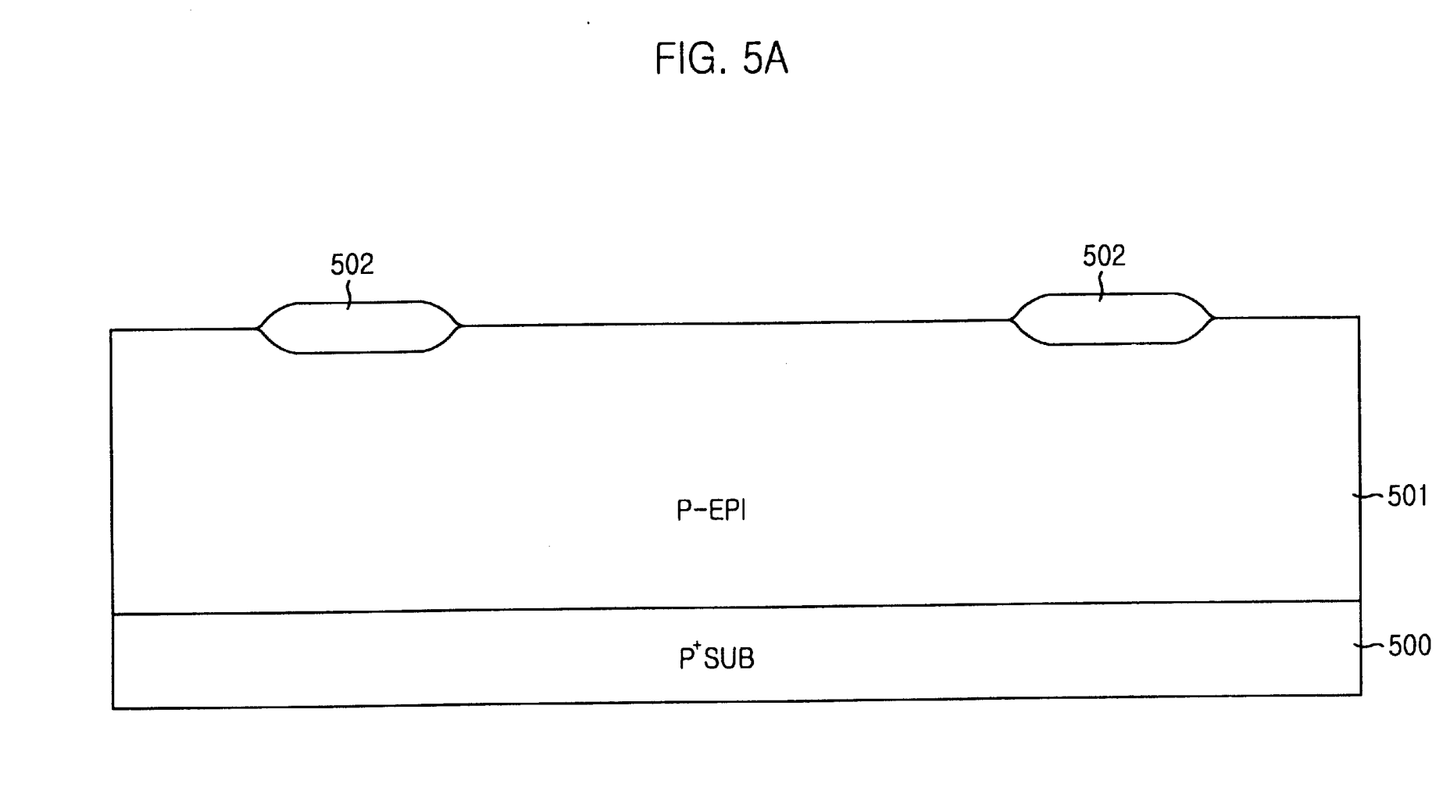
FIGS. 5A to 5D are cross-sectional views illustrating a method for fabricating the unit pixel in FIG. 4.

Referring to FIG. 5A, a P-epi layer 501 is formed on a $P^+$ substrate 500 and field oxide layers 502 are formed on the P-epi layer 501 between active regions by a LOCOS (local oxidation of silicon) process or by a trench isolation process.

Figure 5B:
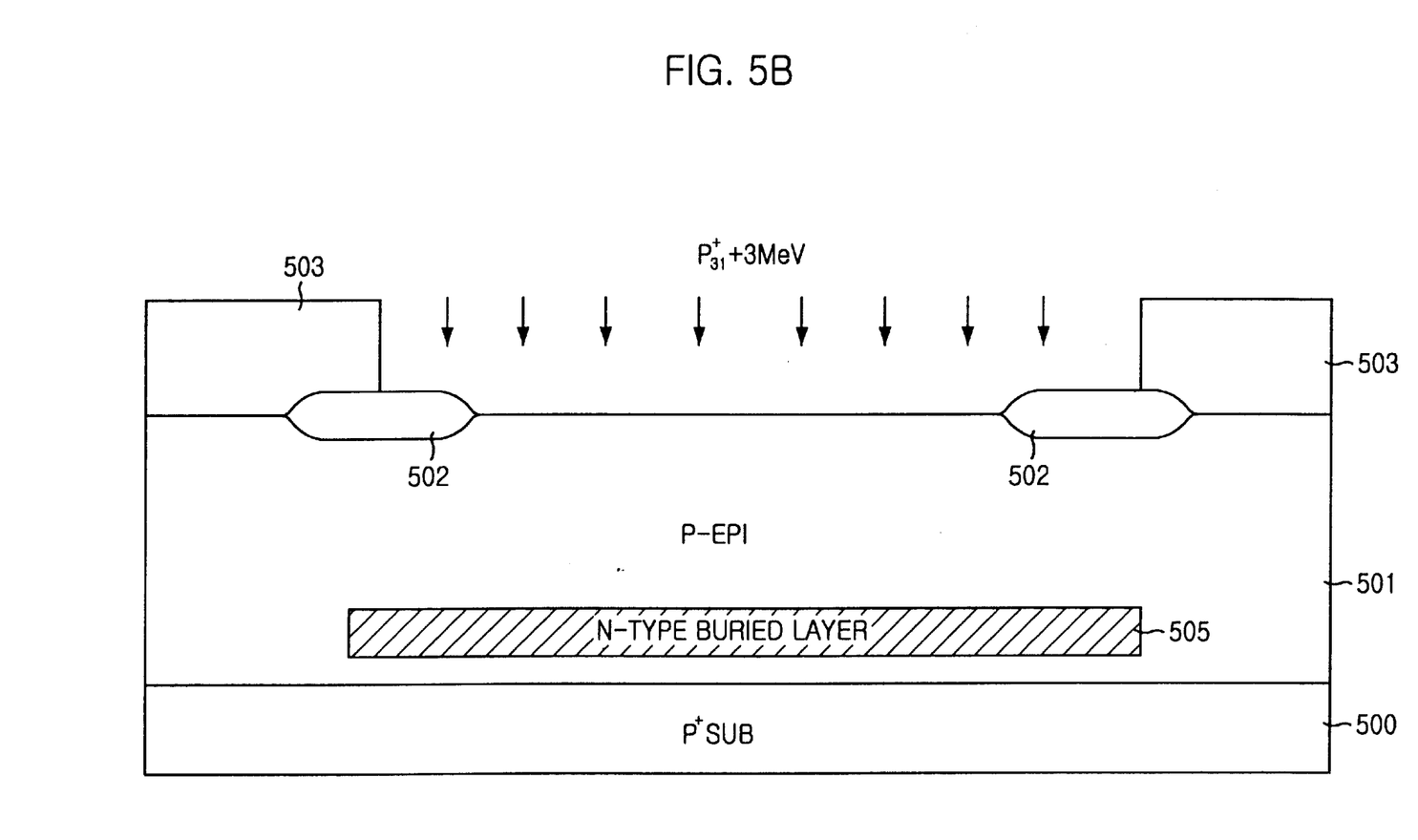

Referring to FIG. 5B, a mask pattern 503 is provided to expose what will comprise the active region of the unit pixel. After forming the mask pattern 503, a first N-type buried layer 505 is formed in the P-epi layer 501 using a $P_{31}^+$ (phosphor) ion implantation of N-type impurities at an acceleration energy of approximately 3 MeV.

Figure 5C:
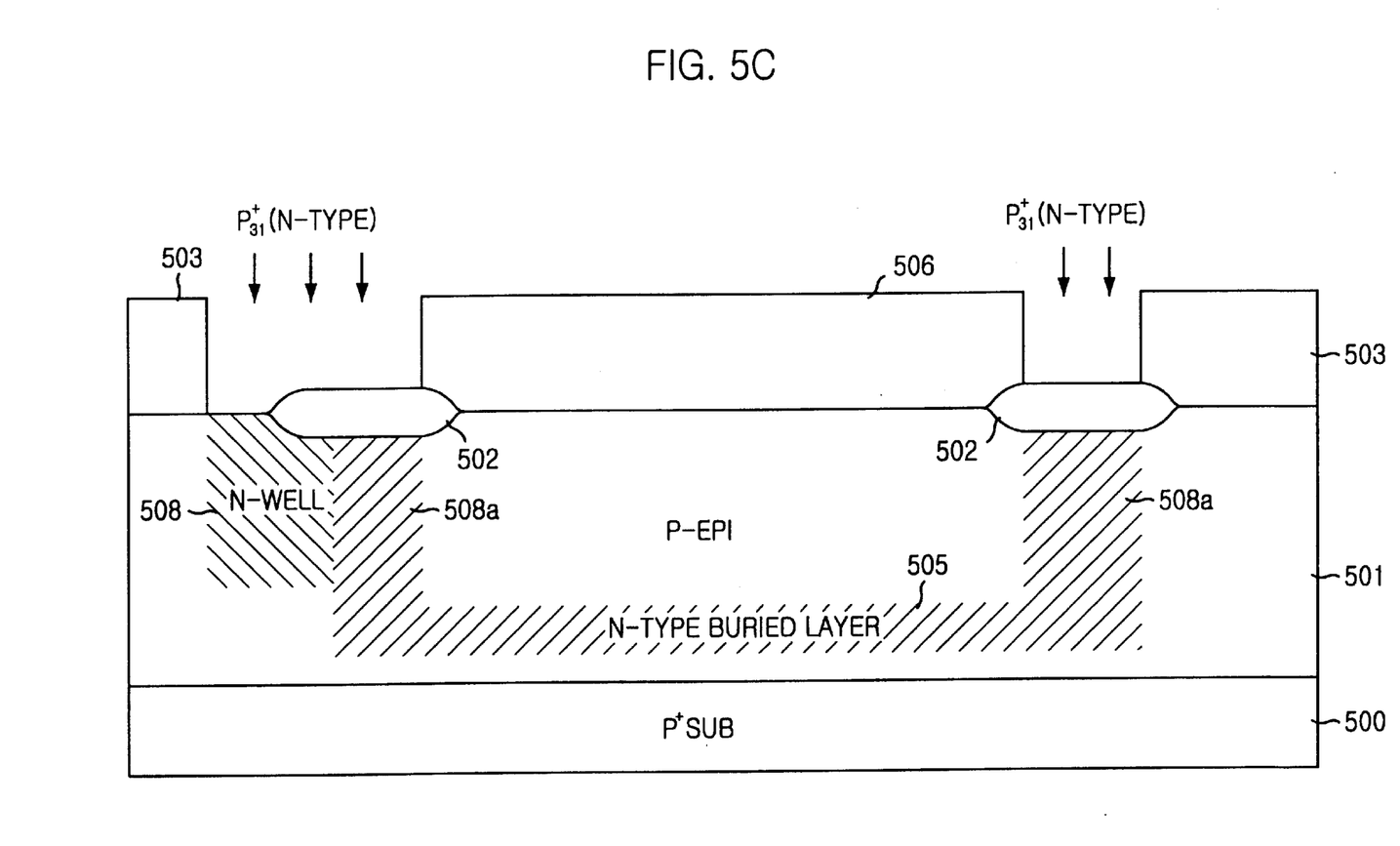

Referring to FIG. 5C, a mask pattern 506 is formed between the field oxide layers 502. After forming the mask pattern 506, a second N-type buried layer 508a is formed beneath the field oxide layers 502. The P-epi layer 501 corresponding to the active region is surrounded by the first N-type buried layer 505 and the second N-type buried layer 508a. In addition, an N-well region 508 in a neighboring unit pixel may be formed at the time of forming the second N-type buried layer 508a.

Figure 5D:
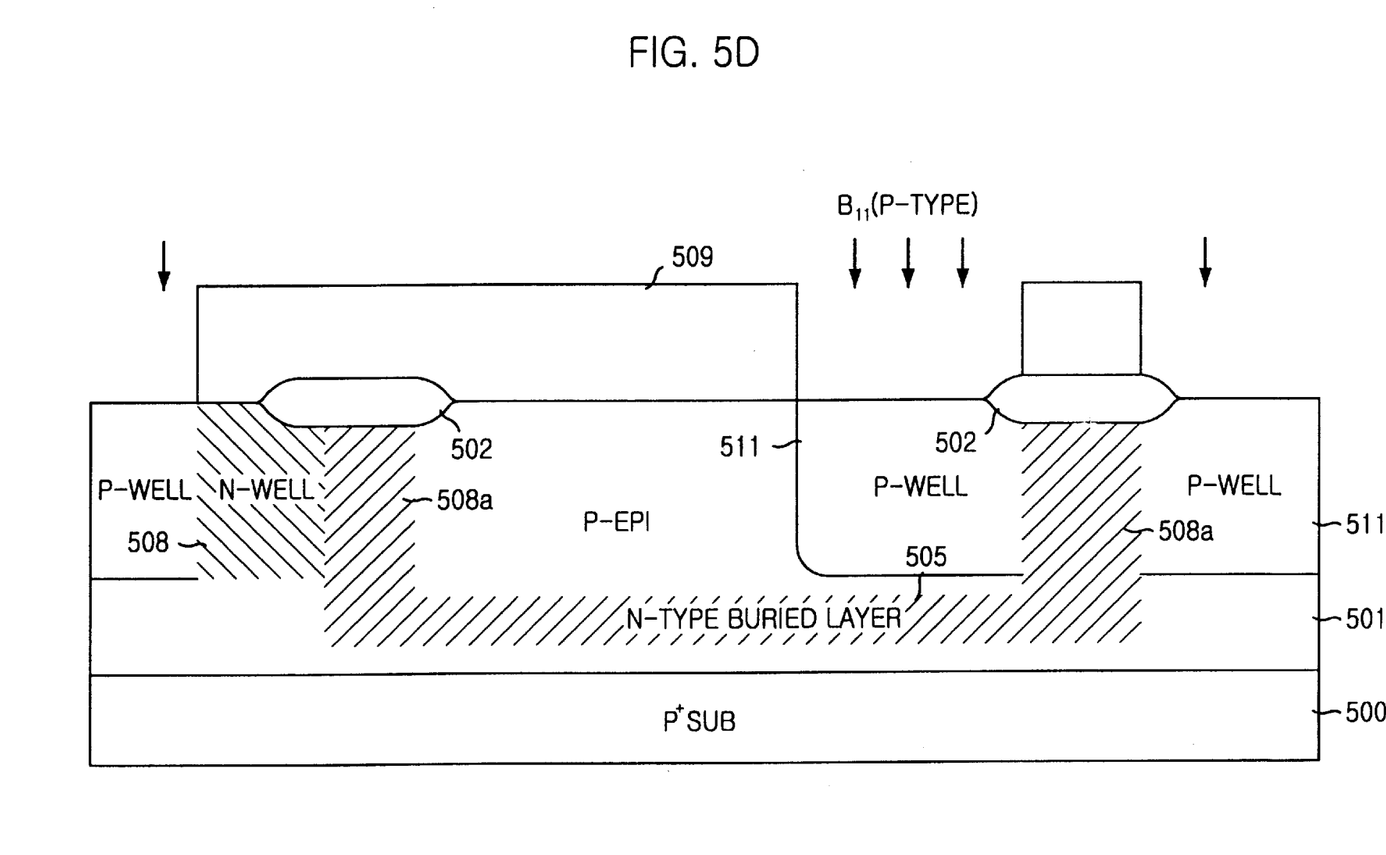

Referring to FIG. 5D, after removing the mask patterns 503 and 501, a P-well mask pattern 509 is formed and a P-well region 511 is formed by a $B_{11}$ (boron) ion implantation of P-type impurities.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An image sensor, comprising:
   a substrate having a first conductivity type;
   a plurality of unit pixels formed in a first region of the substrate; and
   a peripheral circuit formed in a second region of the substrate, the peripheral circuit operable to generate a negative voltage relative to a ground reference, wherein the first region is biased at the negative voltage and the second region is biased at the ground reference.

2. The image sensor of claim 1, wherein the first and second regions have a second conductivity type.

3. The image sensor of claim 1, wherein each unit pixel comprises a photodiode that is reverse biased at the negative voltage.

4. The image sensor of claim 3, wherein each unit pixel further comprises:
   a transfer transistor having a gate controlled by a transfer signal, a source coupled to the photodiode, a body biased at the negative voltage and a drain coupled to a sense node.

5. The image sensor of claim 4, wherein each unit pixel further comprises a capacitor having a first end coupled to the sense node and a second end coupled to the negative voltage.

6. The image sensor of claim 5, wherein each unit pixel further comprises a reset transistor having a gate controlled by a reset signal, a source coupled to the sense node, a drain coupled to a positive power supply and a body biased at the negative voltage.

7. The image sensor of claim 6, wherein each unit pixel further comprises a drive transistor having a gate coupled to the sense node, a drain coupled to the positive power supply, a body biased at the negative voltage and a source.

8. The image sensor of claim 7, wherein each unit pixel further comprises a select transistor having a gate controlled by a select transistor, a drain coupled to the source of the drive transistor, a body biased at the negative voltage and a source embodying an output of the unit pixel.

* * * * *